United States Patent [19]
Mori et al.

[11] Patent Number: 5,579,147
[45] Date of Patent: Nov. 26, 1996

[54] SCANNING LIGHT EXPOSURE APPARATUS

[75] Inventors: Susumu Mori; Tsuyoshi Naraki, both of Tokyo, Japan

[73] Assignee: Nikon Corporation, Tokyo, Japan

[21] Appl. No.: 354,715

[22] Filed: Dec. 6, 1994

[30] Foreign Application Priority Data

Dec. 8, 1993 [JP] Japan .................................. 5-308221

[51] Int. Cl.⁶ .................................................. G02B 26/08
[52] U.S. Cl. .......................... 359/204; 359/201; 250/548; 356/401; 355/46
[58] Field of Search .................................... 359/201, 738, 359/202, 739, 204, 740; 250/548, 205; 356/401; 355/46, 53, 67, 70, 71

[56] References Cited

U.S. PATENT DOCUMENTS

| 4,316,665 | 2/1982 | Mochizuki et al. | 355/46 |
| 4,350,431 | 9/1982 | Mechizuki et al. | 355/46 |
| 5,172,189 | 12/1992 | Mitome | 250/548 |
| 5,359,389 | 10/1994 | Isohata | 355/46 |

*Primary Examiner*—James Phan
*Attorney, Agent, or Firm*—Shapiro and Shapiro

[57] ABSTRACT

A scanning light exposure apparatus comprises illumination optical systems for radiating light beams to a plurality of sub-areas in a pattern area of a mask, a plurality of projection optical systems arranged along a predetermined direction for projecting erected images of unity magnification of the sub-areas by the light beams transmitted through the mask onto a photo-sensitive substrate, a diaphragm member arranged at a substantially conjugate position to the photo-sensitive substrate in each illumination optical system for limiting a projection area of the sub-area to the photo-sensitive substrate, scanning means for synchronously scanning said mask and said photo-sensitive substrate substantially transversely to the predetermined direction relative to said projection optical systems and diaphragm control means for changing a width of an aperture of each diaphragm member along a direction transverse to the predetermined direction.

4 Claims, 5 Drawing Sheets

SCANNING LIGHT EXPOSURE APPARATUS

BACKGROUND OF THE INVENTION

1. Field of the Invention

The present invention relates to a scanning light exposure apparatus, and more particularly to a light exposure apparatus suitable for the exposure of light to a large size board such as a liquid crystal display board.

2. Related Background Art

A quality of a liquid crystal display panel has recently been significantly improved, and because of its thinness and light weight, it has been widely used in place of a CRT. Particularly, in an active matrix type direct view liquid crystal panel, a screen size has been increases and a size of a glass board used for the manufacture thereof has also been increased.

As a light exposure apparatus for exposing a light to such a large size glass substrate, a so-called proximity system in which a mask and a substrate are placed in proximity and a light is exposed collectively, a step and repeat system which uses a diffraction optical system of unity magnification having a large transfer area as a projection optical system, or a mirror projection system in which a projection optical system is a reflection optical system of unity magnification and a mask is illuminated by an arcuate illumination light and an arcuate image of the mask is formed on a substrate, and the mask and the substrate are scanned relative to the projection optical system.

When a large size substrate is exposed in the proximity system, it is necessary to proximate the mask which is large in size in accordance with the substrate size to the substrate to several tens microns. As a result, the mask and the substrate contact to each other because of unevenness of the mask and the substrate, the unevenness of the surface of a resist applied to the substrate or the dusts deposited on the surface thereof, and hence it has been difficult to transfer the mask pattern to the entire surface of the substrate without defect. Further, since a spacing between the mask and the substrate materially affects to a resolution of the image transferred, a line width and a line shape, it does not fit to the manufacture of the active matrix liquid crystal panel or a fine STN liquid crystal panel unless the spacing is uniformly designed.

In the step and repeat system, a reticle of approximately 6 inches which is smaller than the substrate is used as a mask and it is transferred to the large size substrate by the step and repeat. Since the step and repeat system permits the use of the reticle used in the manufacture of a semiconductor device as a mask, the techniques developed in the manufacture of the semiconductor device such as a draw precision, a pattern size control and dust processing can be used. However, in the transfer to the large size substrate, in order to expose a light beyond an area of an effective projection area (image circle), a so-called split exposure system in which a transfer area of the substrate is split into sub-areas for light exposure must be adopted. However, in the active matrix liquid crystal panel display, when there is a slight deviation in a boundary area of the pattern formed by the split light exposure, the performance of the element in that area will change, which causes a variation in density on the completed liquid crystal panel. This is easily visually recognized by human beings and it is a defect in the display quality of the liquid crystal display panel. The larger the number of splits is, the larger is the number of times of light exposure and it is necessary to exchange the reticle many times during the exposure of one substrate. This will lower the processing capability of the apparatus.

In the mirror projection system, since the entire surface of the mask is transferred to the substrate by scanning the arcuate slit extending transversely to the scan direction of the mask and the substrate relative to the mask and the substrate, it is necessary that the length of the slit is as long as the dimension of the substrate in order to efficiently expose the light to the large size substrate. As a result, it is necessary that the optical system is of large scale and the apparatus becomes large, which causes the increase of cost.

SUMMARY OF THE INVENTION

It is an object of the present invention to provide a light exposure apparatus which permits the light exposure to a large area in an efficient manner by using a plurality of small size (small image circle) projection optical systems.

In order to achieve the above object, the present invention provides a scanning light exposure apparatus comprising a plurality of illumination optical systems for radiating light beams to a plurality of sub-areas in a pattern area of a mask; a plurality of projection optical systems arranged along a predetermined direction for projecting erected images of unity magnification of the sub-areas by the light beams transmitted through the mask onto a photo-sensitive substrate; each illumination optical system having a diaphragm member arranged at a substantially conjugate position to the photo-sensitive substrate in said illumination optical system for limiting a projection area of the sub-area to the photo-sensitive substrate; scanning means for synchronously scanning said mask and said photo-sensitive substrate substantially transversely to the predetermined direction relative to said projection optical systems; and diaphragm control means for changing a width of an aperture of each diaphragm member along a direction transverse to the predetermined direction.

In the present invention, a plurality of projection optical systems which focus erected images of unity magnification transversely (Y direction) to the scan direction of the mask and the photo-sensitive substrate, and the mask and the photo-sensitive substrate are synchronously scanned relative to the plurality of projection optical systems. Thus, the sub-area as a projection area which is long transversely to the scan direction can be formed without increasing the size of the image circle of the respective projection optical systems. Accordingly, a larger sub-area as a projection area than that of a conventional system can be attained while using small size projection optical systems and a compact and low cost scanning light exposure apparatus is provided.

Further, since the diaphragm control means for changing a width of an aperture of each diaphragm member in the scan direction is provided, an amount of light exposure to the photo-sensitive substrate of a light beam from each projection optical system can be changed so that the amount of light exposure to the photo-sensitive substrate is rendered uniform.

DETAILED DESCRIPTION OF THE PREFERRED EMBODIMENTS

Figure 1:
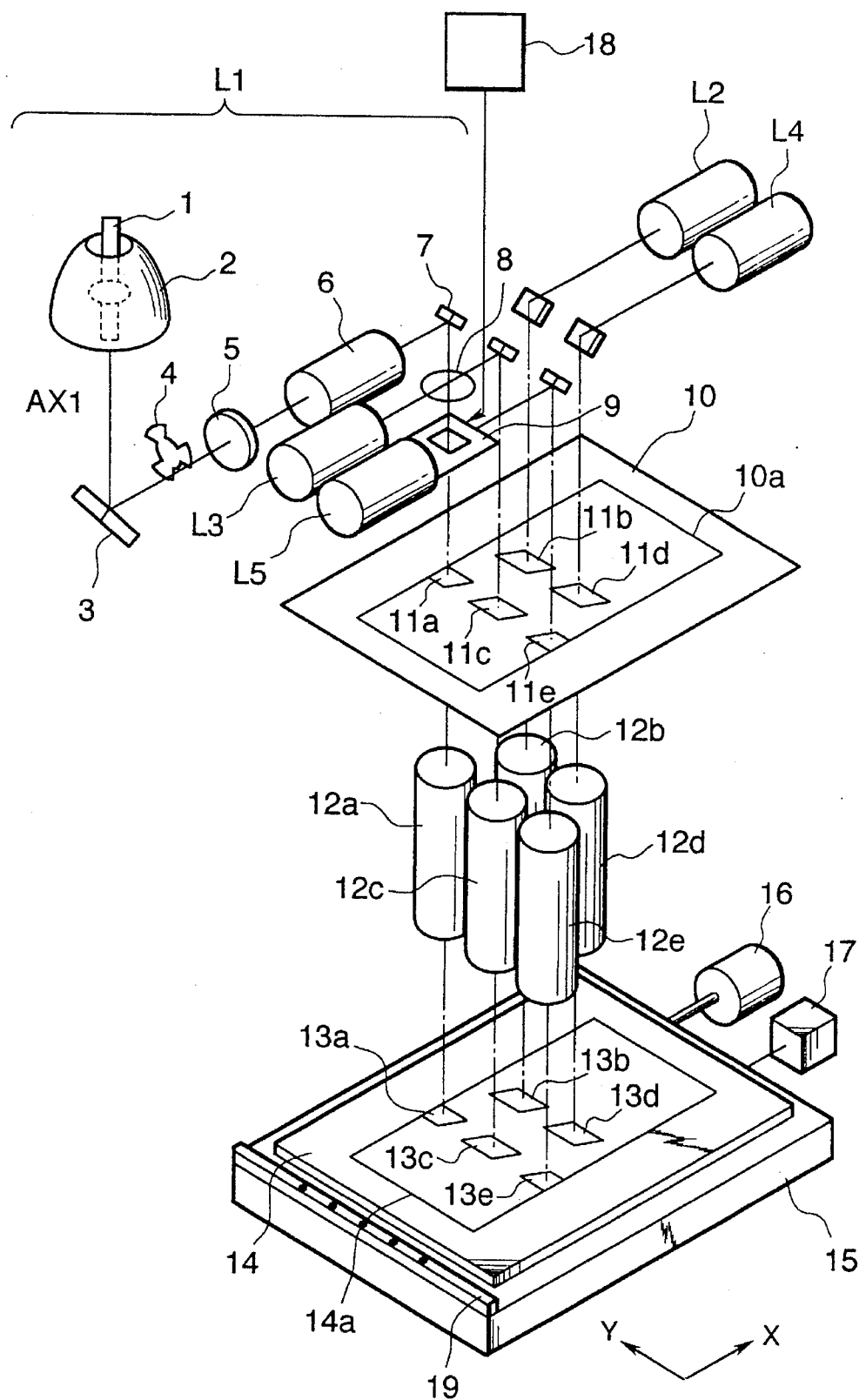
FIG. 1 shows a schematic construction of an embodiment of a scanning light exposure apparatus of the present invention.

FIG. 1 shows a schematic construction of an embodiment of the scanning light exposure apparatus of the present invention. In an illumination optical system L1, a light beam emitted from a light source 1 such as an ultra high pressure mercury lamp is reflected by an elliptic mirror 2 and directed to a dichroic mirror 3. The dichroic mirror 3 reflects the light beam of a wavelength required for the light exposure and transmits the light beam of other wavelengths. The irradiation of the light beam reflected by the dichroic mirror 3 to the projection optical system is selectively limited by a shutter 4 arranged retractably to an optical axis AX1. When the shutter 4 is opened, the light beam is directed to a wavelength selection filter 5 so that a light beam of a wavelength suitable for the transfer by a projection optical system 12a (normally at least one of g, h and i rays) is produced. An intensity distribution of the light beam is a Gauss distribution in which the intensity is strongest near the optical axis and decreases as it goes toward the periphery. Accordingly, it is necessary to make the intensity uniform in at least a projection area 13a of the projection optical system 12a. To this end, the intensity of the light beam is made uniform by a fly eye lens 6 and a condenser lens 8. A mirror 7 is a deflection mirror on the array.

The light beam having the intensity made uniform is irradiated to a pattern surface of a mask (or reticle) 10 through a view field diaphragm 9. The view field diaphragm 9 has an aperture for limiting (defining) a projection area 13a on a photo-sensitive substrate 14. The aperture of the view field diaphragm 9 can be changed by a diaphragm drive unit 18 to change the size of the projection area 13a on the photo-sensitive substrate 14. A lens system may be provided between the view field diaphragm 9 and mask 10 such that the pattern planes of the view field diaphragm 9 and the mask 10 and the projection plane of the photo-sensitive substrate 14 are conjugate to each other.

The construction from the light source 1 to the view field diaphragm 9 forms the illumination optical system L1 for the projection optical system 12a, and in the present embodiment, illumination optical systems L2–L5 of identical construction to that of the illumination optical system L1 are provided to supply light beams to projection optical systems 12b–12e.

The light beams emitted from the illumination optical systems L1–L5 illuminate different sub-areas (illumination areas) 11a–11e on the mask 10. The light beams transmitted through the mask focus the pattern images of the illumination areas 11a–11e of the mask 10 in the different projection areas 13a–13e on the photo-sensitive substrate 14 through different projection optical systems 12a–12e. The projection optical systems 12a–12e are erected image, unity magnification real image systems.

Figure 2:
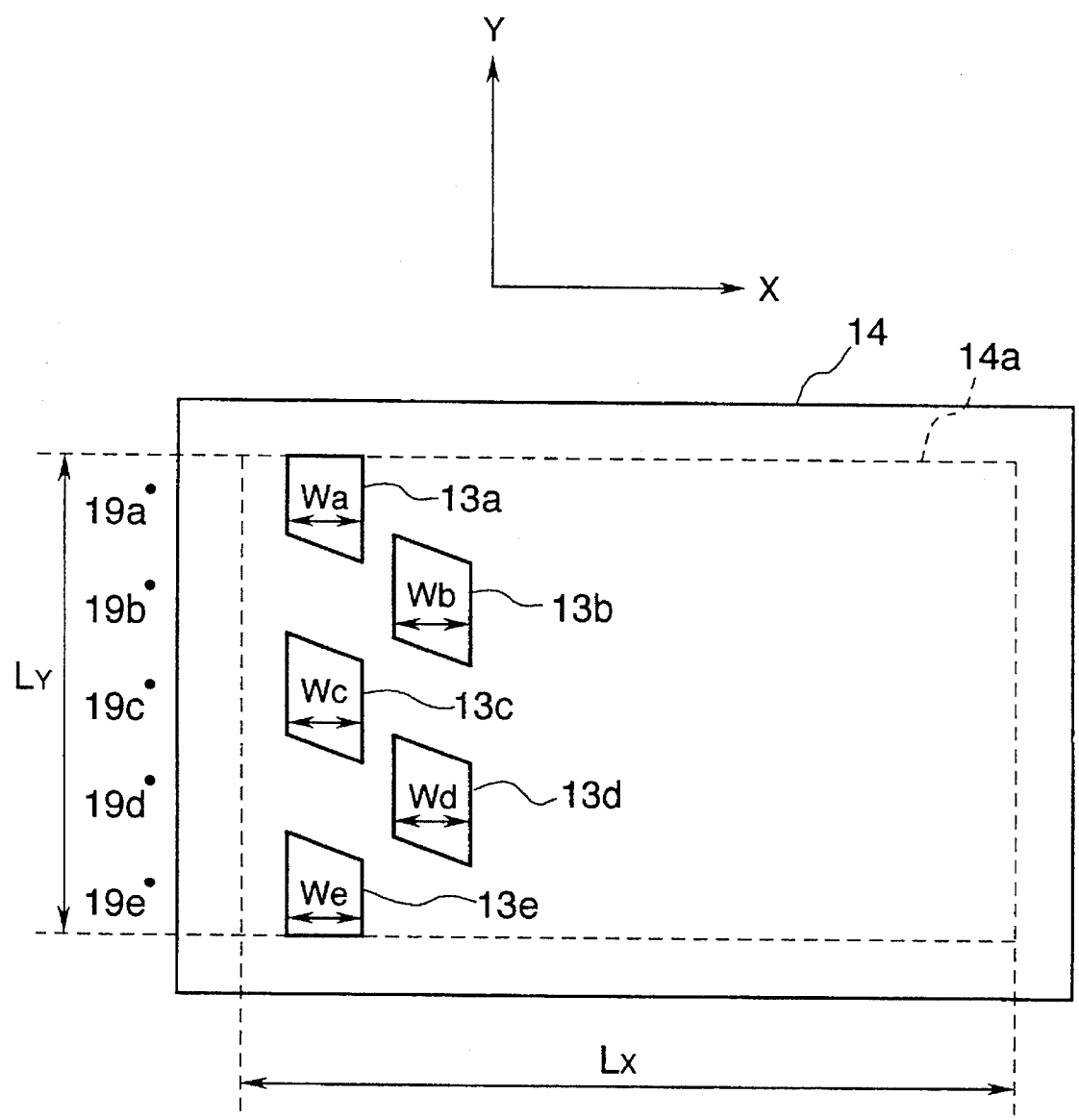
FIG. 2 illustrates a projection area on a photo-sensitive substrate.

The projection areas 13a–13e on the photo-sensitive substrate 14 are arranged along the Y axis as shown in FIG. 2 such that adjacent areas (for example, 13a and 13b, or 13b and 13c) are displaced by a predetermined distance along the X axis and the ends of the adjacent areas overlap along the Y axis. Accordingly, the projection optical systems 12a–12e are also displaced by a predetermined distance along the X axis and overlap along the Y axis in accordance with the arrangement of the projection areas 13a–13e. The illumination optical systems L1–L5 are arranged such that the illumination areas on the mask 10 are arranged in the same manner as that of the projection areas 13a–13e. The mask 10 and the photo-sensitive substrate 14 are synchronously scanned relative to the projection optical systems 12a–12e along the X axis to transfer the entire area of the pattern area 10a on the mask to the exposure area 14a on the photo-sensitive substrate.

The photo-sensitive substrate 14 is mounted on a substrate stage 15 which has a drive unit 16 having a long stroke along the scan direction (X axis) to conduct the one-dimensional scanning light exposure. It also has a high resolution and high precision position measurement apparatus (for example, laser interferometer) 17 along the scan direction. The mask 10 is supported by a mask stage, not shown, which also has a position measurement apparatus for detecting a position of the drive unit and the stage along the scan direction as the substrate stage 15 does. An illumination sensor 19 having an input plane in the same plane as the projection plane of the photo-sensitive substrate is provided on the substrate stage 15 to detect the intensity of the light beams irradiated to the photo-sensitive substrate through the illumination optical systems and the projection optical systems.

The image of each projection optical system applied to the light exposure apparatus of the present embodiment should be the erected image because the projection optical systems are arranged transversely to the scan direction. Further, in order to increase the moving precision of the mask and the photo-sensitive substrate and prevent the increase of the size of the apparatus due to the change in the move direction, the mask and the photo-sensitive substrate may be moved together. Thus, in the present invention, the mask and the photo-sensitive substrate are scanned relative to the projection optical system in the same direction by the same distance and the projection optical systems are erected image, unity magnification real image systems.

An operation of the light exposure apparatus of the present invention is now explained. In the active matrix liquid crystal panel, it is required to expose the light while a plurality of pattern layers are superimposed in the manufacturing process in order to form the active element. Accordingly, a plurality of masks 10 serving as the master substrates are required. The mask 10 to be used for one layer is positioned relative to the light exposure apparatus by a mask alignment system, not shown, held by a holding member (not shown) which holds the projection optical systems. Similarly, the photo-sensitive substrate 14 is also positioned relative to the light exposure apparatus. The light is exposed while the mask 10 and the photo-sensitive substrate 14 are positioned and the mask and the photo-sensitive substrate are synchronously scanned relative to the projection optical system along the X axis at the same velocity. The scan in the distance Lx of the scan range along the X axis should be done at a constant velocity (V) in order to attain the same exposure condition (uniform amount of exposure) in the exposure area 14a defined by the distances Lx and Ly. Thus, in the scan along the X axis, an approach is required so that the constant velocity is reached before it reaches the focus range Lx of the projection optical system. A resulting amount of exposure D (J/cm$^2$) is given by $$D = Pw/v \qquad (1)$$

where P (W/cm²) is an intensity of the light beam and w (cm) is a width of the aperture. Accordingly, the respective parameters may be determined based on the amount of exposure required for the photo-sensitive material applied to the photo-sensitive substrate 14.

Since the scanning light exposure apparatus as shown in FIG. 1 uses a plurality of illumination optical systems and a plurality of projection optical systems, there is no assurance that the intensities of the light beams irradiated on the photo-sensitive substrate through those optical systems are uniform. This is due to the variation of the brilliance of the light sources and the difference in the transmissivities of the optical elements of the illumination optical systems and the projection optical systems. In order to make the intensities of those beams uniform, an applied voltage to the light source may be fed back in accordance with the intensity or a dimmer material may be inserted in a light path of the light beam. However, in any case, it is difficult to attain the required precision. In the present invention, by using the fact that a difference in the size of the projection area results in a difference in the amount of exposure to the photo-sensitive substrate, the width of the aperture as changed in accordance with the intensity of the corresponding light beam in order to change the size of the projection area.

It is assumed that the intensities of the light beams of the projection optical systems 12a–12e acquired at the detection positions 19a–19e (see FIG. 2) of an illumination sensor 19 on the photo-sensitive substrate are Pa–Pe, and the amount of exposure applied to the photo-sensitive substrate 14 by the light beam from the projection optical system 12a is Da, then $$Da = Pa \cdot wa/v \qquad (2)$$

In order to attain uniform amount of exposure on the photo-sensitive substrate, it is necessary that $$Da = Db = Dc = Dd = De \qquad (3)$$

where Db–De are amounts of exposure applied to the photo-sensitive substrate 14 by the light beams from the projection optical systems 12b–12e, respectively. The widths wa–we of the projection areas 13a–13e, respectively, along the X axis are changed to meet the following relation.

$$Pa \cdot wa = Pb \cdot wb = Pc \cdot wc = Pd \cdot wd = Pe \cdot we \qquad (4)$$

Figure 3:
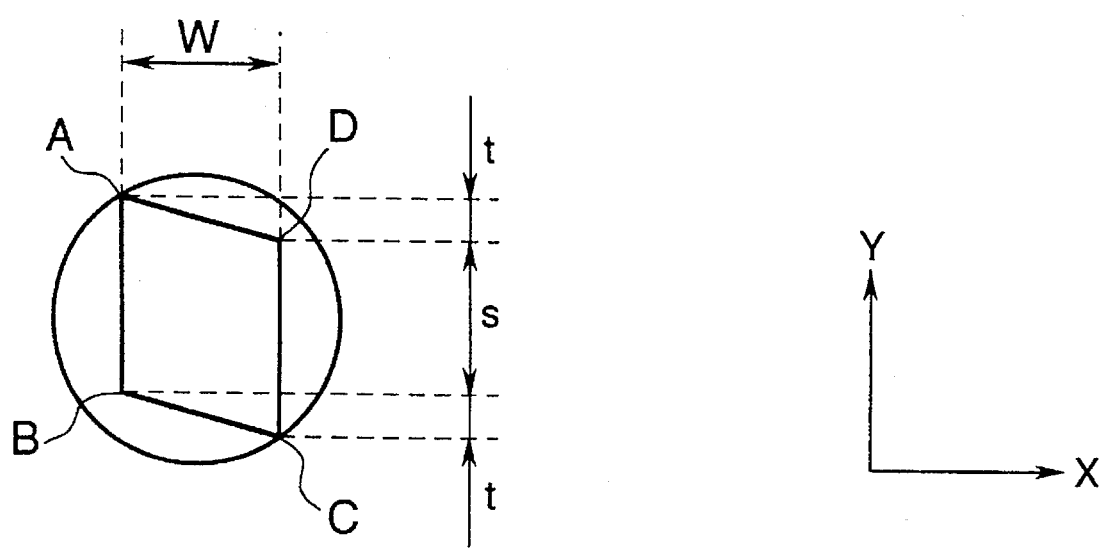
FIG. 3 shows a method for changing an aperture width of a view field diaphragm in an embodiment of the present invention.
Figure 4:
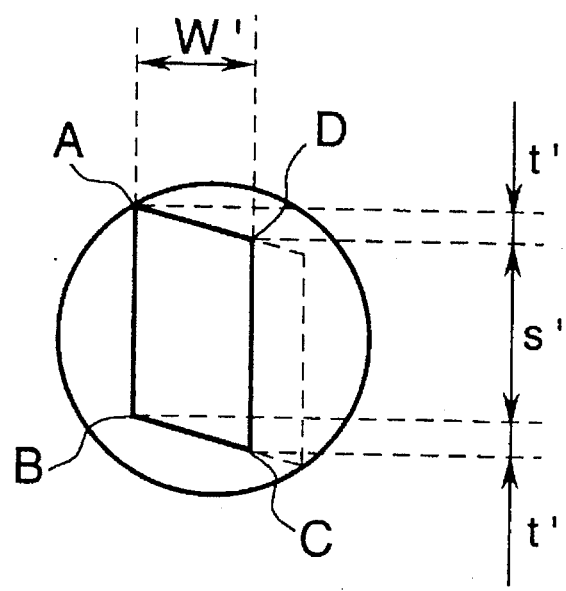
FIG. 4 shows a method for changing an aperture width of a view field diaphragm.
Figure 5:
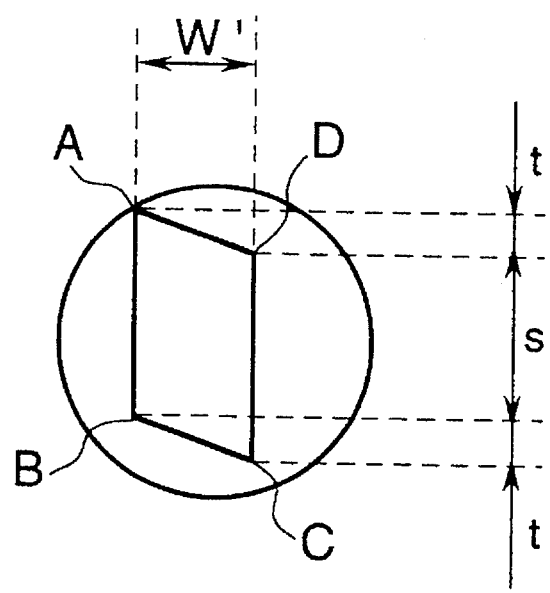
FIG. 5 shows a method for changing an aperture width of a view field diaphragm in an embodiment of the present invention.

Referring to FIGS. 3 to 5, the change of the aperture width of a view field diaphragm 9 is explained. Prior to the transfer of the image of the mask pattern to the photo-sensitive substrate, the light beam is irradiated while the mask is not mounted on the apparatus. Under this condition, the intensities of the light beams from the respective projection optical systems are detected. Based on the detected intensities, the widths wa–we of the projection areas 14a–14e are determined, and the width of the aperture of each view field diaphragm 9 is set to attain the determined widths. The circle in FIGS. 3 to 5 shows the area which can be projected by one projection system, that is, an image circle. The pattern area which is transferred by a projection optical system (that is, a projection area limited by the aperture of the view field diaphragm 9) is determined within the circle. In FIG. 3, a range s along the Y direction corresponds to a dimension of an area in to which the transfer is made by only one projection optical system, and a range t corresponds to a dimension an overlap area in which the transfer is made by a combination of one projection optical system and an adjacent projection optical system. It is assumed that the aperture width w is to be changed to w' in accordance with the illumination. In FIG. 3, the sides AB and DC are parallel and the sides AD and BC make a predetermined angle to the X axis. When the side DC is moved along the X axis with reference to the side AB in FIG. 3 and if the aperture width is changed to w' without changing the inclination of the sides AD and BC as shown in FIG. 4, the range s changes to the range s' and the range changes to the range t', and $$s \neq s', \ t \neq t' \qquad (5)$$

Thus, matching of the positional relation between the projection area of one projection optical system and the projection area of an adjacent projection optical system is not attained and the uniformity of the amount of exposure is lowered. Thus, as shown in FIG. 5, when the side DC is moved with reference to the side AD, the aperture width w' is changed while the inclination of the sides AD and BC is changed so that the Y coordinates of the points D and C do not change. In this manner, the range s and the range t can be maintained constant.

In accordance with the present embodiment, since the aperture width of the view field diaphragms along the scan direction can be changed in accordance with the intensities of the light beams through the projection optical systems, the amounts of exposure to the photo-sensitive substrate are uniform even if the intensities of the illumination optical systems are not uniform.

In the above embodiment, the shape of the polygon area by which a pattern transfer is made by each projection optical system (projection area) a parallelepiped (13a–13e) as shown in FIG. 2. Alternatively, a view field diaphragm having a pedestal or hexagonal aperture may be used to form a pedestal or hexagonal projection area. In any case, the width along the scan direction (X axis in FIG. 2) may be changed in the same manner as that described above. When the projection area is divided to the range s which is projected by one projection optical system in one scan to the photo-sensitive substrate and the range t which is projected by a plurality of scans or a plurality of projection optical systems, the shape should be such that a sum of the amounts of exposure of the area designated by t to the photo-sensitive substrate corresponds to the amount of exposure of the area designated by s.

While five illumination sensors (the same number as that of the projection optical systems) are provided on the substrate stage transversely to the scan direction of the photo-sensitive substrate, one illumination sensor may be moved to detect all intensities.

In the above embodiment, the projection optical systems are arranged transversely (along the Y axis) to the scan direction of the photo-sensitive substrate and displaced from each other along the scan direction (X direction). However, the arrangement of the projection optical systems is not limited thereto but other light exposure apparatus having a plurality of projection optical systems may be applied to the present invention.

What is claimed is:

1. A scanning light exposure apparatus comprising:
   a plurality of illumination optical systems for irradiating light beams to a corresponding plurality of sub-areas in a pattern area of a mask;
   a plurality of projection optical systems arranged along a predetermined direction for projecting erected images of unity magnification of the sub-areas by respective light beams transmitted through the mask onto a photo-sensitive substrate;

each illumination optical system having a diaphragm member arranged at a substantially conjugate position to the photo-sensitive substrate in said illumination optical system for limiting a projection area of the sub-area to the photo-sensitive substrate;

scanning means for synchronously scanning said mask and said photo-sensitive substrate substantially transversely to the predetermined direction relative to said projection optical system; and diaphragm control means for changing a width of an aperture of each diaphragm member along a direction transverse to the predetermined direction.

2. A scanning light exposure apparatus according to claim 1 further comprising:

a light intensity sensor for detecting intensities of the light beams on a substantially same plane as that of the photo-sensitive substrate;

the width of the aperture being changed in accordance with the detection result of said light intensity sensor.

3. A scanning light exposure apparatus according to claim 1 wherein the sub-area is a polygon having a side at a predetermined angle to the direction transverse to the predetermined direction, and the predetermined angle changes with the change of the width.

4. A scanning light exposure apparatus according to claim 1 wherein the sub-area is a polygon having a first side at a predetermined angle to the direction transverse to the predetermined direction and a second side extending along the predetermined direction, and the width is changed such that a component for the predetermined direction at a crosspoint of the first side and the second side is kept unchanged.

* * * * *